US006511782B1

(12) United States Patent
Vermeersch et al.

(10) Patent No.: US 6,511,782 B1

(45) **Date of Patent: *Jan. 28, 2003**

(54) HEAT SENSITIVE ELEMENT AND A METHOD FOR PRODUCING LITHOGRAPHIC PLATES THEREWITH

(75) Inventors: Joan Vermeersch, Deinze (BE); Marc Van Damme, Mechelen (BE)

(73) Assignee: Agfa-Gevaert, Mortsel (BE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,393

(22) Filed: Jan. 22, 1999

Related U.S. Application Data

(60) Provisional application No. 60/077,355, filed on Mar. 9, 1998.

(30) Foreign Application Priority Data

Jan. 23, 1998 (EP) ........................................... 98200187

(51) Int. Cl.[7] ............................................... G03F 7/038

(52) U.S. Cl. .................... 430/270.1; 430/302; 430/348; 430/495.1; 430/944; 430/945; 430/964; 101/454; 101/465

(58) Field of Search ............................. 430/270.1, 302, 430/348, 494, 495.1, 944, 945, 964; 101/454, 465

(56) References Cited

U.S. PATENT DOCUMENTS

| | | | | | |
|---|---|---|---|---|---|
| 4,871,656 | A | * | 10/1989 | Parton et al. | 430/522 |
| 5,260,178 | A | * | 11/1993 | Harada et al. | 430/508 |
| 5,340,699 | A | * | 8/1994 | Haley et al. | 430/302 |
| 5,387,496 | A | | 2/1995 | DeBoer | |
| 5,747,233 | A | | 5/1998 | Lonsky et al. | |
| 5,840,467 | A | * | 11/1998 | Kitatani et al. | 430/302 |
| 5,858,604 | A | * | 1/1999 | Takeda et al. | 430/162 |
| 5,972,838 | A | * | 10/1999 | Pearce et al. | 503/227 |
| 5,985,514 | A | * | 11/1999 | Zheng et al. | 430/270.1 |
| 6,004,728 | A | * | 12/1999 | Deroover et al. | 430/302 |
| 6,051,361 | A | * | 4/2000 | Hattori et al. | 430/270.1 |
| 6,083,663 | A | * | 7/2000 | Vermeersch et al. | 430/302 |
| 6,096,471 | A | * | 8/2000 | Van Damme et al. | 430/188 |
| 6,146,812 | A | * | 11/2000 | Leon et al. | 430/270.1 |
| 6,153,353 | A | * | 11/2000 | Van Damme et al. | 430/270.1 |
| 6,162,578 | A | * | 12/2000 | Zheng et al. | 430/270.1 |
| 6,174,646 | B1 | * | 1/2001 | Hirai et al. | 430/302 |
| 6,187,502 | B1 | * | 2/2001 | Chapman et al. | 430/201 |
| 6,190,830 | B1 | * | 2/2001 | Leon et al. | 430/270.1 |
| 6,238,838 | B1 | * | 5/2001 | Gaschler et al. | 430/278.1 |
| 6,342,336 | B2 | * | 1/2002 | Verschueren et al. | 430/271.1 |
| 2001/0018159 | A1 | * | 8/2001 | Maemoto | 430/138 |
| 2001/0046638 | A1 | * | 11/2001 | Yanaka et al. | 430/138 |
| 2002/0006575 | A1 | * | 1/2002 | Elsaesser et al. | |
| 2002/0007751 | A1 | * | 1/2002 | Inoue et al. | 101/453 |
| 2002/0009574 | A1 | * | 1/2002 | Hiraoka et al. | 428/158 |
| 2002/0117066 | A1 | * | 8/2002 | Kawamura et al. | 101/462 |

FOREIGN PATENT DOCUMENTS

| | | | | | |
|---|---|---|---|---|---|
| EP | 751 421 | A2 | * | 1/1997 | |
| EP | 0 770 495 | A1 | | 5/1997 | |
| EP | 0 770 497 | A1 | | 5/1997 | |
| EP | 931 647 | A1 | * | 7/1999 | B41C/1/10 |
| JP | 62103192 | A | * | 5/1987 | |
| JP | 11-265062 | | * | 9/1999 | G03F/7/004 |

OTHER PUBLICATIONS

Narayanan, Narasimhachari et al., A New Method for the Synthesis of Heptamethine Cyanine Dyes: Synthesis of New Near–Infrared Fluorescent Labels, 1995, J. Org. Chem., 2391–2395.*

* cited by examiner

*Primary Examiner*—Janet Baxter
*Assistant Examiner*—Barbara Gilliam
(74) *Attorney, Agent, or Firm*—Breiner & Breiner, L.L.C.

(57) ABSTRACT

According to the present invention there is provided a heat sensitive imaging element comprising on a lithographic base with a hydrophilic surface an image forming layer including thermoplastic particles of a homopolymer or a copolymer of styrene and a hydrophilic polymer containing carboxyl groups, characterized in that said imaging element further contains an anionic IR-cyanine dye being present in said image forming layer or a layer adjacent thereto.

10 Claims, No Drawings

HEAT SENSITIVE ELEMENT AND A METHOD FOR PRODUCING LITHOGRAPHIC PLATES THEREWITH

The application claims benefit of U.S. Provisional Application No. 60/077,355 filed Mar. 9, 1998.

FIELD OF THE INVENTION

The present invention relates to a heat sensitive material for making a lithographic printing plate. The present invention further relates to a method for preparing a printing plate from said heat sensitive material.

BACKGROUND OF THE INVENTION.

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat sensitive printing plate precursors is clearly seen on the market.

For example, Research Disclosure no. 33303 of January 1992 discloses a heat sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

EP-A-514 145 discloses a heat sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599 510 discloses a heat sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive group or precursor therefor, such that insolubilisation of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilisation. However the printing endurance of a so obtained printing plate is low.

EP-A-625 728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin,a novolac resin, a latent Bronsted acid and an IR-absorbing substance. The printing results of a lithographic plate obtained by irradiating and developing said imaging element are poor.

U.S. Pat. No. 4,708,925 discloses a positive working imaging element including a photosensitive composition comprising an alkali-soluble novolac resin and an onium-salt. This composition can optionally contain an IR-sensitizer. After image-wise exposing said imaging element to UV—visible—or eventually IR-radiation followed by a development step with an aqueous alkali liquid there is obtained a positive working printing plate. The printing results of a lithographic plate obtained by irradiating and developing said imaging element are poor.

EP-A-96 200 972.6 discloses a heat sensitive imaging element comprising on a hydrophilic surface of a lithographic base an image forming layer comprising hydrophobic thermoplastic polymer particles dispersed in a water insoluble alkali soluble or swellable resin and a compound capable of converting light into heat, said compound being present in said image forming layer or a layer adjacent thereto, wherein said alkali swellable or soluble resin comprises phenolic hydroxy groups and/or carboxyl groups. However by exposure with short pixel times of said heat-sensitive imaging element there occurs ablation on the exposed areas resulting in an insufficient ink acceptance.

Analogous imaging elements comprising on a hydrophilic surface of a lithographic base an image forming layer comprising hydrophobic thermoplastic polymer particles dispersed in a water or alkali soluble or swellable resin and a compound capable of converting light into heat, said compound being present in said image forming layer or a layer adjacent thereto are disclosed in e.g. EP-A-770 494, EP-A-770 495, EP-A-770 496, EP-A-770 497, EP-A-773 112, EP-A-773 113, EP-A-774 364, EP-A-800 928, EP-A-96 202 685, EP-A-96 203 003, EP-A-96 203 004 and EP-A-96 203 633. In most of these applications poly(meth) acrylate latices are used as thermoplastic polymer particles and no specific hydrophilic resin is mentioned. In most cases carbon black or an IR-dye are mentioned as the compound capable of converting light into heat.

In order to prepare an imaging element as described above, that is processable on the press, preferably IR-dyes should be used. Carbon black causes indeed a soiling on the press when removing the unexposed areas. On the other hand when using IR-dyes the unexposed areas are not completely dissolved when developing on the press resulting in scumming.

Furthermore the ink acceptance and the sensitivity of said imaging elements could use some improvement.

OBJECTS OF THE INVENTION

It is an object of the present invention to provide a heat sensitive imaging element with a high sensitivity and developable on a press.

It is a further object of the present invention to provide a heat sensitive imaging element for making in a convenient way a lithographic printing plate having excellent ink acceptance.

It is another object of the present invention to provide a heat sensitive imaging element for making in a convenient way a lithographic printing plate having good developability.

It is still another object of the present invention to provide a heat sensitive imaging element for making in a convenient way a lithographic printing plate having no scumming.

It is still another object of the present invention to provide a method for obtaining in a convenient way a negative working lithographic printing plate which gives prints with excellent printing properties using said imaging element.

Further objects of the present invention will become clear from the description hereinafter.

SUMMARY OF THE INVENTION.

According to the present invention there is provided a heat sensitive imaging element comprising on a lithographic base with a hydrophilic surface an image forming layer including thermoplastic particles of a homopolymer or a copolymer of styrene and a hydrophilic polymer containing carboxyl groups, characterized in that said imaging element further contains an anionic IR- cyanine dye being present in said image forming layer or a layer adjacent thereto.

DETAILED DESCRIPTION OF THE INVENTION

It has been found that lithographic printing plates of high quality, giving prints with excellent ink acceptance can be obtained according to the method of the present invention using an imaging element as described above. More precisely it has been found that said printing plates are of high quality and are provided in a convenient way, thereby offering economical and ecological advantages.

The image forming layer or a layer adjacent thereto comprises in accordance with the present invention an anionic IR-cyanine dye, which serves as light to heat converting compound. A mixture of anionic IR-cyanine dyes may be used, but it is preferred to use only one anionic IR-cyanine dye. Particularly useful anionic IR-cyanine dyes are IR-cyanines dyes with at least two sulphonic groups. Still more preferably are IR-cyanines dyes with two indolenine and at least two sulphonic acid groups. Most preferable is compound I with the structures as indicated. Compound II with the structure as indicated gives also very good results.

(I)

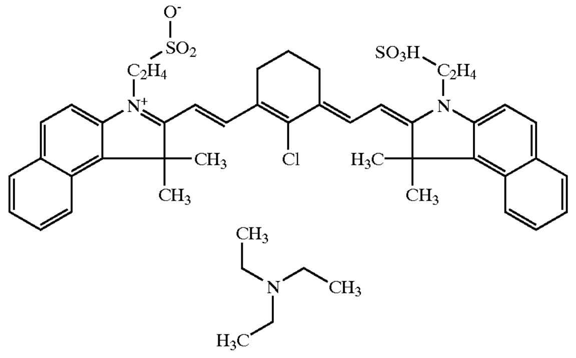

(II)

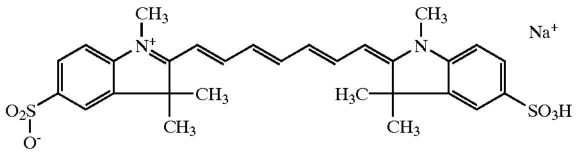

The amount of anionic IR-cyanine dye contained in the image forming layer is preferably between 1% by weight and 40% by weight and more preferably between 2% by weight and 30% by weight and most preferably between 5% by weight and 20% by weight of said image forming layer.

According to one embodiment of the present invention, the lithographic base having a hydrophilic surface can be an anodised aluminum. A particularly preferred lithographic base having a hydrophilic surface is an electrochemically grained and anodised aluminum support. Most preferably said aluminum support is grained in nitric acid, yielding imaging elements with a higher sensitivity. According to the present invention, an anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination.

According to another embodiment in connection with the present invention, the lithographic base having a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A-601 240, GB-P-1 419 512, FR-P-2 300 354, U.S. Pat. No. 3,971,660, g U.S. Pat. No. 4,284,705 and EP-A-514 490.

As flexible support of a lithographic base in connection with the present embodiment it is particularly preferred to use a plastic film e.g. substrated polyethylene terephthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per m2 and 750 mg per m2. Further, the ratio of silica to hydrophilic binder is preferably more than 1 and the surface area of the colloidal silica is preferably at least 300 m2 per gram, more preferably at least 500 m2 per gram.

The hydrophobic thermoplastic polymer latices used in connection with the present invention are copolymers or preferably homopolymers of styrene and preferably have a coagulation temperature above 50° C. and more preferably above 70° C. Coagulation may result from softening or melting of the thermoplastic polymer latices under the influence of heat. There is no specific upper limit to the coagulation temperature of the thermoplastic hydrophobic polymer latices, however the temperature should be sufficiently below the decomposition temperature of the polymer latices. Preferably the coagulation temperature is at least 10° C. below the temperature at which the decomposition of the polymer latices occurs. When said polymer latices are subjected to a temperature above the coagulation temperature they coagulate to form a hydrophobic agglomerate so that at these parts the hydrophobic latices become insoluble in plain water or an aqueous liquid.

The weight average molecular weight of the hydrophobic thermoplastic polymer may range from 5,000 to 1,000,000g/mol.

The hydrophobic thermoplastic polymer latex may have a particle size from 0.01 μm to 50 μm, more preferably between 0.01 μm and 10 μm, still more preferably between 0.01 μm and 1 μm and most preferably between 0.02 μm.and 0.15 μm.

The hydrophobic thermoplastic polymer latex is present as a dispersion in the aqueous coating liquid of the image forming layer and may be prepared by the methods disclosed in U.S. Pat. No. 3,476,937. Another method especially suitable for preparing an aqueous dispersion of the thermoplastic polymer latex comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer latex contained in the image forming layer is preferably between 20% by weight and 95% by weight and more preferably between 40% by weight and 90% by weight and most preferably between 50% by weight and 85% by weight of said image forming layer.

The image forming layer also contains as binder a hydrophilic polymer containing carboxyl groups. Preferably said polymer containing carboxyl groups is a homo- or copolymer of poly(meth)acrylate. The weight average molecular weight of the hydrophilic polymer may range from 2,000 to 1,000,000g/mol, more preferably from 5000 to 500,000 g:mol, most preferably from 10,000 to 100,000 g/mol.

The image forming layer can also comprise crosslinking agents although this is not necessary. Preferred crosslinking agents are low molecular weight substances comprising a methylol group such as for example melamine-formaldehyde resins, glycoluril-formaldehyde resins, thiourea-formaldehyde resins, guanamine-formaldehyde resins, benzoguanamine-formaldehyde resins. A number of said melamine-formaldehyde resins and glycoluril-formaldehyde resins are commercially available under the trade names of CYMEL (Dyno Cyanamid Co., Ltd.) and NIKALAC (Sanwa Chemical Co., Ltd.)

An anionic IR-cyanine dye in connection with the present invention is most preferably added to the image forming layer but at least part of the anionic IR-cyanine dye may also be comprised in a neighbouring layer. Such layer can be for example the cross-linked hydrophilic layer of the lithographic base according to the second embodiment of lithographic bases explained above.

In accordance with a method of the present invention for obtaining a printing plate, the imaging element is image-wise exposed to IR-light and subsequently developed with an aqueous solution having a pH between 3.5 and 13, most preferably between 4 and 8.

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

In another embodiment of the invention the exposure of the imaging element can be carried out with the imaging element already on the press. A computer or other information source supplies graphics and textual information to a L.E.D. or a laser via a lead. After the development of an image-wise exposed imaging element with an aqueous solution and drying the obtained plate can be used as a printing plate.

In accordance with a method of the present invention for obtaining a printing plate, the imaging element is image-wise exposed and subsequently is mounted on a print cylinder of a printing press. According to one preferred embodiment, the printing press is then started and while the print cylinder with the imaging element mounted thereon rotates, the dampener rollers that supply dampening liquid are dropped on the imaging element and subsequent thereto the ink rollers are dropped. Generally, after a few revolutions of the print cylinder the first clear and useful prints are obtained.

According to a preferred method, the ink rollers and dampener rollers may be dropped simultaneously. In an alternative method the ink rollers may be dropped first.

Suitable dampening liquids that can be used in connection with the present invention are aqueous liquids generally having an acidic pH and comprising an alcohol such as isopropanol. With regard to dampening liquids useful in the present invention, there is no particular limitation and commercially available dampening liquids, also known as fountain solutions, can be used.

It may be advantageous to wipe the image forming layer of an image-wise exposed imaging element with e.g. a cotton pad or sponge soaked with water before mounting the imaging element on the press or at least before the printing press starts running. This will remove some non-image areas but will not actually develop the imaging element. However, it has the advantage that possible substantial contamination of the dampening system of the press and ink used is avoided.

EXAMPLE 1

Comparative Example

Preparation of the Lithographic Base

A 0.30 mm thick aluminum foil was degreased by immersing the foil in an aqueous solution containing 5 g/l of sodium hydroxide at 500° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 mm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m2 for about 300 seconds to form an anodic oxidation film of 3.00 g/m2 of Al2O3, then washed with demineralized water and posttreated with a solution containing polyvinylphosphonic acid, rinsed with demineralized water at 20° C. during 120 seconds and dried.

Preparation of the Imaging Elements

An imaging element according to the invention was produced by preparing the following coating composition 1 and coating it to the above described lithographic base in an amount of 30 $g/m^2$ (wet coating amount) and drying it at 35° C.

Imaging elements 2-3-4 were produced by preparing the coating compositions 2-3-4 and coating them to the above described lithographic base in an amount of 30 $g/m^2$ (wet coating amount) and drying it at 35° C.

Preparation of the Coating Composition 1

To 7.5 g of a 20% w/w dispersion of polystyrene (particle diameter of 60 nm) stabilized with a surfactant (1.5% w/w vs. polymer) in deionized water was added 20 g of a 1% w/w solution of compound I To the above obtained solution was added 66.5 g deionized water and 6 g of a 5% w/w solution of CARBOPOL WS801 (polyacrilic acid commercially available from Goodrich)

Preparation of the Coating Composition 2

To 7.5 g of a 20% w/w dispersion of polystyrene (particle diameter of 60 nm) stabilized with a surfactant (1.5% w/w vs. polymer) in deionized water was added 20 g of a 1% w/w solution of compound I).

To the above obtained solution was added 66.5 g deionized water and 6 g of a 5% w/w solution of MOWIOL 56 98 (polyvinylalcohol commercially available from Hoechst)

Preparation of the Coating Composition 3

To 7.5 g of a 20% w/w dispersion of polystyrene (particle diameter of 60 nm) stabilized with a surfactant (1.5% w/w vs. polymer) in deionized water was added 20 g of a 1% w/w solution of compound II.

To the above obtained solution was added 66.5 g deionized water and 20 6 g of a 5% w/w solution of CARBOPOL WS801 (polyacrylic acid commercially available from Goodrich).

Preparation of the coating composition 4

To 7.5 g of a 20% w/w dispersion of polystyrene (particle diameter of 60 nm) stabilized with a surfactant (1.5% w/w vs. polymer) in deionized water was added 20 g of a 1% w/w solution of compound II.

To the above obtained solution was added 66.5 g deionized water and 6 g of a 5% w/w solution of MOWIOL 56 98 (polyvinylalcohol commercially available from Hoechst).

Preparation of a Printing Plate and Making Copies of the Original

Each of imaging element 1–4 as described above was subjected to a scanning diode laser emitting at 830 nm (scanspeed 1 m/s, at 2540 dpi and the power on the plate surface was 44 mW). After imaging the plate was processed on a press Heidelberg GTO46, using Van Son rubberbase VS2329 ink and Rotamatic fountain to remove the unexposed areas resulting in a negative working lithographic printing plate.

Table 1 gives the results : only the imaging elements according to the invention are printed without noticeable scumming in the unexposed areas.

TABLE 1

| coating composition | lithographic result | clean up | run length |
|---|---|---|---|
| 1 | no scumming | 1 | 15,000 |
| 2 | scumming | >250 | — |
| 3 | light scumming | 1 | — |
| 4 | scumming | >100 | — |

Clean up = number of sheets required to remove unexposed parts.

EXAMPLE 2 comparative

Preparation of the Lithographic Base

A lithographic base was prepared as described in example 1.

Preparation of the Imaging Elements

An imaging element 5 according to the invention was produced by preparing the coating composition 5 and coating it to the above described lithographic base in an amount of 30 g/m$^2$ (wet coating amount) and drying it at 35° C.

Other imaging elements 6-7-8 were produced by preparing the coating compositions 6-7-8 and coating them to the above described lithographic base in an amount of 30 g/m$^2$ (wet coating amount) and drying it at 35° C.

Preparation of the Coating Composition 5

To 7.5g of a 20% w/w dispersion of polystyrene (particle diameter of 60 nm) stabilized with a surfactant (1.5% w/w vs. polymer) in deionized water was added 20 g of a 1% w/w solution of compound I.

To the above obtained solution was added 66.5 g deionized water and (i 6 g of a 5% w/w solution of a copolymer of acrylamide and acrylic acid.

Preparation of the Coating Composition 6

To 7.5 g of a 20% w/w dispersion of polystyrene (particle diameter of 60 nm) stabilized with a surfactant (1.5% w/w vs. polymer) in deionized water was added 20 g of a 1% w/w solution of compound I.

To the above obtained solution was added 66.5g deionized water and 6.g of a 5% w/w solution of a copolymer of acrylic acid, vinyl alcohol and vinyl acetate.

Preparation of the Coating Composition 7

To 7.5 g of a 20% w/w dispersion of polystyrene (particle diameter of 60 nm) stabilized with a surfactant (1.5% w/w vs. polymer) in deionized water was added 20g of a 1% w/w solution of compound I.

To the above obtained solution was added 66.5 g deionized water and 6.g of a 5% w/w solution of a polyacrylamide homopolymer.

Preparation of the Coating Composition 8

To 7.5 g of a 20% w/w dispersion of polystyrene (particle diameter of 60 nm) stabilized with a surfactant (1.5% w/w vs. polymer) in deionized water was added 20 g of a 1%w/w solution of 4 compound I.

To the above obtained solution was added 66.5 g deionized water and 30 6.g of a 5% w/w solution of CARBOPOL WS801 (polyacrylic acid commercially available from Goodrich)

Preparation of a Printing Plate and Making Copies of the Original

Imaging element 5–8 as described above were imaged with a Creo 3244T thermal platesetter using 830 nm laser diodes (scanspeed 75 rpm at 2540dpi and the total power on the plate surface was 11 W).

After imaging the plate was processed on a press Heidelberg GT046, using Van Son rubberbase VS2329 ink and Rotamatic fountain to remove the unexposed areas resulting in a negative working lithographic printing plate.

Table 2 gives the results : only the imaging elements according to the invention are printed without scumming in the unexposed areas.

TABLE 2

| coating composition | lithographic result | clean up |
|---|---|---|
| 5 | no scumming | 1 |
| 6 | no scumming | 1 |
| 7 | scumming | 5 |
| 8 | no scumming | 1 |

Clean up = number of sheets required to remove unexposed parts.

What is claimed is:

1. A heat sensitive imaging element comprising on a lithographic base with a hydrophilic surface an image forming layer including thermoplastic particles of a homopolymer or a copolymer of styrene and a hydrophilic polymer containing carboxyl groups, wherein said imaging element further contains an anionic IR-cyanine dye being present in said image forming layer or a layer adjacent thereto.

2. A heat sensitive imaging element according to claim 1 wherein the hydrophilic polymer containing carboxyl groups is a polymer of acrylic acid or methacrylic acid.

3. A heat sensitive imaging element according to claim 1 wherein the anionic IR-cyanine dye is an IR-cyanine dye with at least two sulphonic groups.

4. A heat sensitive imaging element according to claim 3 wherein the anionic IR-cyanine dye is an IR-cyanine dye with two indolenine and at least two sulphonic acid groups.

5. A heat sensitive imaging element according to claim 4 wherein the anionic IR-cyanine dye has the following structure (I)

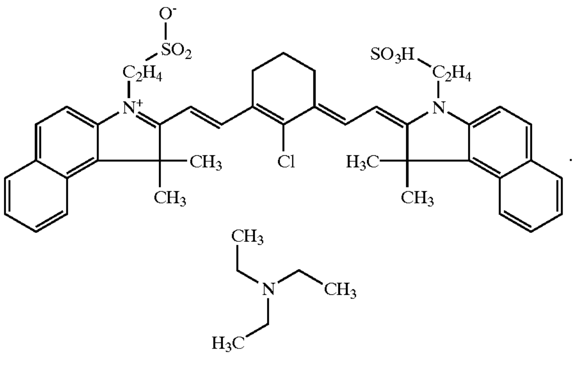

6. A heat sensitive imaging element according to claim 1 wherein the amount of anionic IR-cyanine dye contained in the image forming layer is between 1% by weight and 40% by weight of said image forming layer.

7. A heat sensitive imaging element according to claim 1 wherein the lithographic base having a hydrophilic substrate is grained and anodized aluminum.

8. A heat sensitive imaging element according to claim 7 wherein the anodized aluminum is treated with a polymer selected from the group consisting of polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

9. A method for making a lithographic printing plate comprising the steps of:

(1) image-wise exposing to IR-light a heat sensitive imaging element according to claim 1;

(2) and developing a thus obtained image-wise exposed imaging element by mounting it on a print cylinder of a printing press and supplying an aqueous dampening liquid and/or ink to said image forming layer while rotating said print cylinder.

10. A method for making a lithographic printing plate according to claim 9 wherein said heat sensitive imaging element is mounted on the press before the image-wise exposure.

* * * * *